United States Patent
Thomas

(10) Patent No.: US 6,423,995 B1
(45) Date of Patent: Jul. 23, 2002

(54) SCRATCH PROTECTION FOR DIRECT CONTACT SENSORS

(75) Inventor: Danielle A. Thomas, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/360,839

(22) Filed: Jul. 26, 1999

(51) Int. Cl.$^7$ .............................................. H01L 27/108
(52) U.S. Cl. ........................ 257/296; 257/355; 257/414; 257/758
(58) Field of Search ................................. 257/355, 233, 257/417, 414, 758, 296, 424, 444, 712; 361/283; 382/4

(56) References Cited

U.S. PATENT DOCUMENTS

| | | | | |
|---|---|---|---|---|
| 4,353,056 A | | 10/1982 | Tsikos | ........................ 340/146 |
| 5,325,442 A | | 6/1994 | Knapp | ........................... 382/4 |
| 5,955,781 A | * | 9/1999 | Joshi et al. | .................. 257/712 |
| 6,031,257 A | * | 2/2000 | Noto et al. | .................. 257/202 |

OTHER PUBLICATIONS

Tartagni, et al, "A 390 dpi Live Fingerprint Imager Based on Feedback Capacitive Sensing Scheme", 1997 IEEE International Solid–State Circuits Conference, 1997.

R.F. Wolffenbuttel and P.O.L. Regtien, "Integrated Tactile Imager with an Intrinsic Contour Detection Option", *Sensor and Actuators*, Jan./Feb. 1989, No. 1/2, pp. 141–153.

N.D. Young, et al., "Novel Fingerprint Scanning Arrays Using Polysilicon TFT's of Glass and Polymer Substrates", IEEE Electron Device Letters, V. 18, No. 1, Jan., 1997, pp. 19–20.

* cited by examiner

*Primary Examiner*—Olik Chaudhuri
*Assistant Examiner*—Nathan W. Ha
(74) *Attorney, Agent, or Firm*—Lisa K. Jorgenson; Daniel E. Venglarik

(57) ABSTRACT

In capacitive sensor circuits where physical contact is required and excess pressure may be inadvertently applied to the sensor surface, aluminum is not sufficiently hard to provide "scratch" protection and may delaminate, causing circuit failure, even if passivation integrity remains intact. Because hard passivation layers alone provide insufficient scratch resistance, at least the capacitive electrodes and preferably all metallization levels within the sensor circuit in the region of the capacitive electrodes between the surface and the active regions of the substrate are formed of a conductive material having a hardness greater than that of aluminum. The selected conductive material preferably has a hardness which is at least as great as the lowest hardness for any interlevel dielectric or passivation material employed. The selected conductive material is employed for each metallization level between the surface and the active regions, including contacts and vias, landing pads, interconnects, capacitive electrodes, and electrostatic discharge protection lines. Tungsten is a suitable conductive material, for which existing processes may be substituted in place of aluminum metallization processes.

11 Claims, 3 Drawing Sheets

SCRATCH PROTECTION FOR DIRECT CONTACT SENSORS

RELATED APPLICATIONS

The present invention is related to the subject matter of commonly assigned, copending U.S. patent applications Ser. No. 09/364,307 entitled "SCRATCH RESISTANCE IMPROVEMENT BY FILLING METAL GAPS" and filed Jul. 30, 1999. The content of the above-referenced application is incorporated herein by reference.

BACKGROUND OF THE INVENTION

1. Field of the Invention

The present invention relates generally to scratch protection for integrated sensor circuits, and more specifically to improvement of scratch protection in capacitive sensor circuits through selection of metallization materials.

2. Description of the Prior Art

Fingerprint acquisition circuits employ arrays of sensors coated with a dielectric onto which the finger is placed with the epidermis in contact with the dielectric. The ridges and grooves on the epidermal layer of the finger are then detected by the sensors, which transmit signals representative of the detected pattern. Although various sensors are possible (e.g., resistive, etc.), capacitive sensors have been found to provide the best performance. Since capacitance between two capacitive plates is inversely proportional to the distance between the plates, using the contacting dermal tissue itself as one capacitor plate and the sensor electrode as the other and then determining capacitance for each sensor electrode in the array, it is possible to locate the ridges and grooves of the fingerprint.

Such capacitive sensors cannot be mechanically protected because physical contact on the surface of the integrated circuit with the finger is necessary. However, some scratch resistance protection for the capacitive sensor electrodes is required to prevent "scratch" damage to the sensor electrodes. Such damage typically results from undue (and unnecessary) pressure on the surface of the integrated circuit, alone or in combination with some sharp edge or protrusion such as a callous or scar, fingernail, dust or dirt particle, etc. While extremely hard passivation stacks employing silicon carbide (SiC) have been developed for these circuits, the capacitive electrodes may still become very badly damaged through use.

It would be desirable, therefore, to provide a mechanism for preventing damage to integrated circuits resulting from required contact with a sensor portion of the integrated circuit.

SUMMARY OF THE INVENTION

In capacitive sensor circuits where physical contact is required and excess pressure may be inadvertently applied to the sensor surface, aluminum is not sufficiently hard to provide "scratch" protection and may delaminate, causing circuit failure even if passivation integrity remains intact. Because hard passivation layers alone provide insufficient scratch resistance, all metallization levels within the sensor circuit between the surface and the active regions of the substrate are formed of a conductive material having a hardness greater than that of aluminum. The selected conductive material preferably has a hardness which is at least as great as the lowest hardness for any interlevel dielectric or passivation material employed. The selected conductive material is employed for each metallization level between the surface and the active regions, including contacts and vias, landing pads, interconnects, capacitive electrodes, and electrostatic discharge protection lines. Tungsten is a suitable conductive material, for which existing processes may be substituted in place of aluminum metallization processes.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1A:
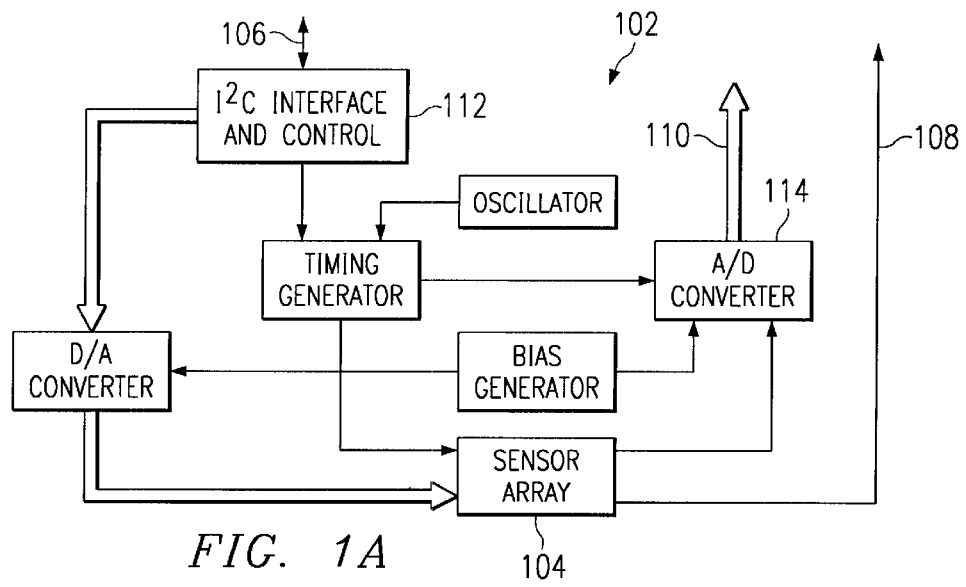
FIGS. 1A–1C depict various views of a sensor circuit employing scratch resistance in accordance with a preferred embodiment of the present invention.
Figure 1B:
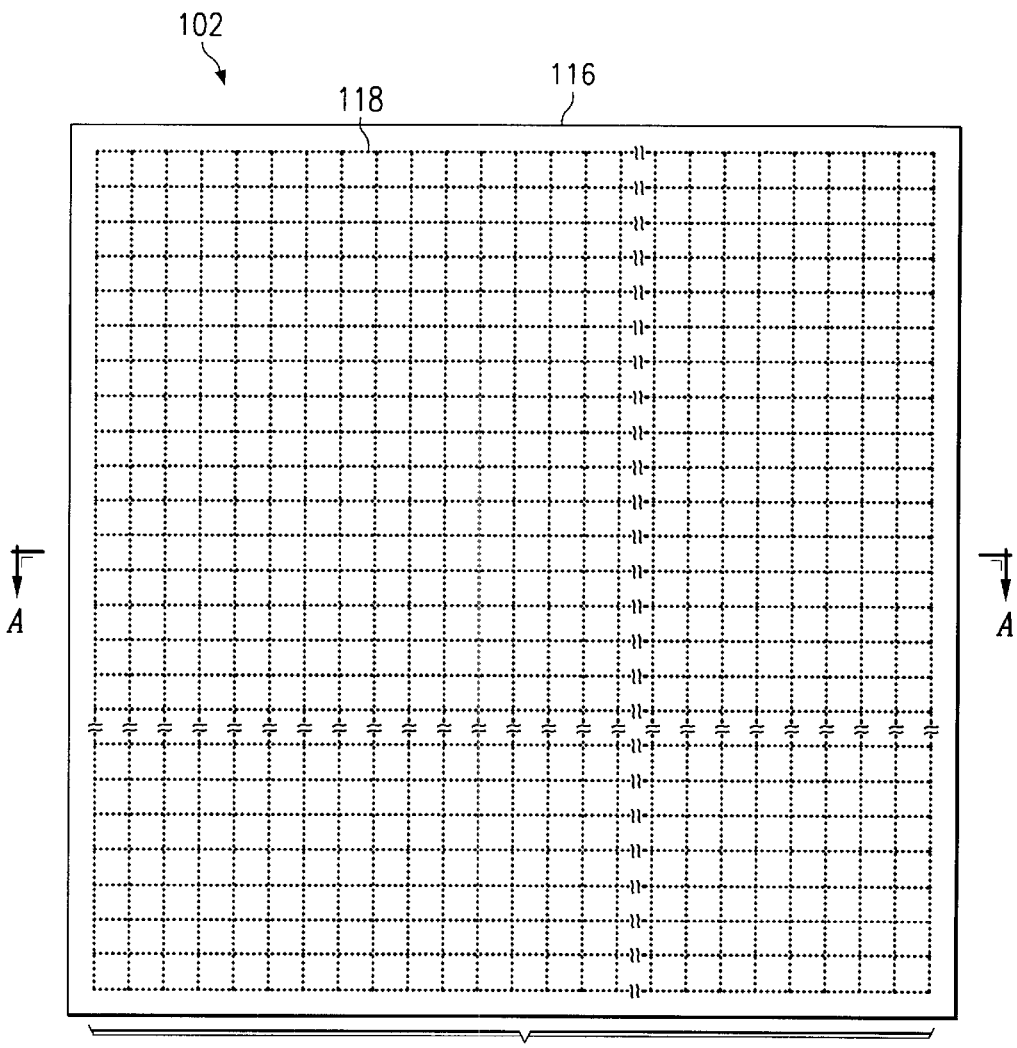
Figure 1C:
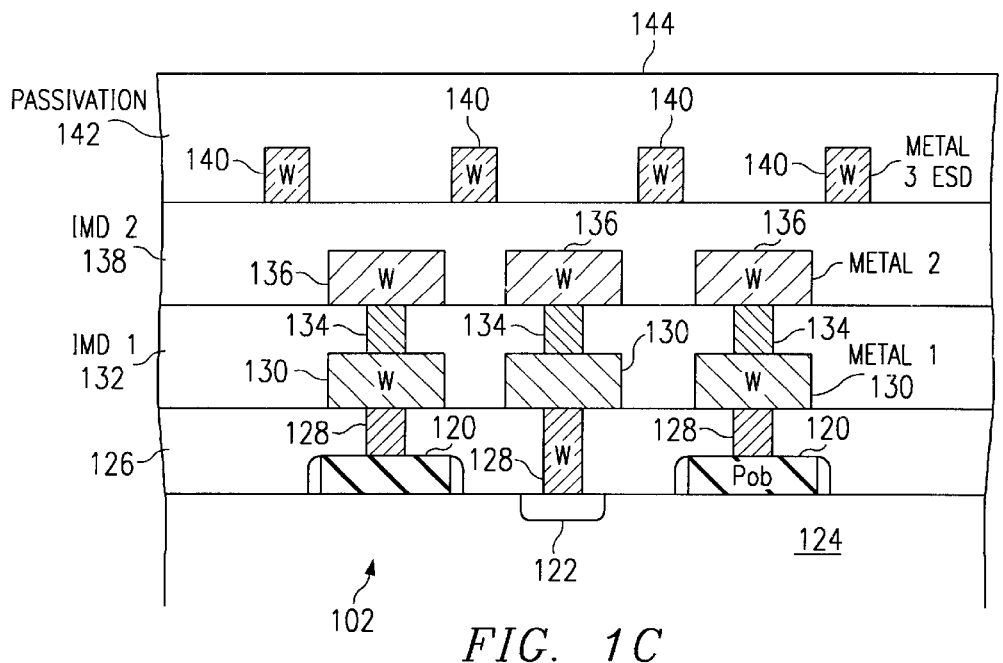

With reference now to the figures, and in particular with reference to FIGS. 1A through 1C, various views of a sensor circuit employing scratch resistance in accordance with a preferred embodiment of the present invention are depicted. FIG. 1A depicts a block diagram of the sensor circuit 102, which is formed as an integrated circuit on a single die. The sensor circuit 102 and its operation are described more fully in commonly assigned, copending application Ser. No. 09/040,261, entitled "CAPACITIVE DISTANCE SENSOR" and filed May 9, 1998, which is incorporated herein by reference.

The portions of sensor circuit 102 relevant to the present invention include an array 104 of capacitive sensors for fingerprint acquisition by sensing distances between capacitive electrodes within the sensor array 104 and ridges and grooves on a finger placed in contact with sensor array 104. Sensor circuit 102 also includes signal lines 106 and 108 and output bus 110. Signal line 106 connects $I^2C$ interface and control device 104, which provides a bidirectional communication protocol enabling sensor circuit 102 to communicate with a controller such as a microcontroller, with controller circuitry (not shown) external to sensor circuit 102. Signal line 108 is a synchronization line coupling sensor array 104 to the external controller circuit, providing synchronization signals allowing detected voltages representative of the capacitive value of individual capacitive electrodes within sensor array 104, and therefore representative of the distance between the capacitive electrode and the portion of the epidermal layer contacting sensor array 104 in the region of the capacitive electrode, to be properly interpreted by the external controller. Output bus 110 coupling an analog-to-digital (A/D) converter 114 to the external controller. A/D converter 114 processes analog voltage measurements received from sensor array 104 and generates digital representations recognized by the external controller as distance measurements of the analog measured voltages from individual capacitive electrodes within sensor array 104. A/D converter 114 transmits these digital signals to the external controller on output bus 110.

FIG. 1B is a pictorial representation of the "front" side of sensor circuit 102; that is, FIG. 1B depicts the major surface of the die 116 on which the active devices constituting sensor circuit 102 are formed. Sensor array 104 is located on the front side of die 116 and includes a plurality of cells 118, each containing one or more capacitive electrodes. Sensor array 104 in the exemplary embodiment contains square cells approximately 45–50 μm on a side, forming a 250×350 array of contiguous cells 118 within sensor array 104. Sensor array 104 is covered by a passivation material overlying the capacitive electrodes within each cell 118. Other active devices required to form sensor circuit 102 are formed below the capacitive electrodes.

FIG. 1C is a cross-sectional detail of a sensor array cell as seen from a cross-section taken along section line A—A. Sensor circuit 102 within a sensor array cell includes one or more active areas, such as polysilicon electrodes 120 or source/drain region 122 within a substrate 124. An intermetal dielectric 132 overlies metal regions 130 and dielectric 126, with openings therethrough in which are formed metal vias 134 connecting metal regions 130 to capacitive electrodes 136 overlying the interlevel dielectric 132.

Capacitive electrodes 136 are covered by a second intermetal dielectric 138, on which are formed electrostatic discharge (ESD) protection patterns 140. A passivation layer 142, which may actually comprise multiple layers, covers the ESD protection lines 140 and forms the surface 144 which is contacted by the epidermal layer of the finger during fingerprint acquisition.

Figure 2:
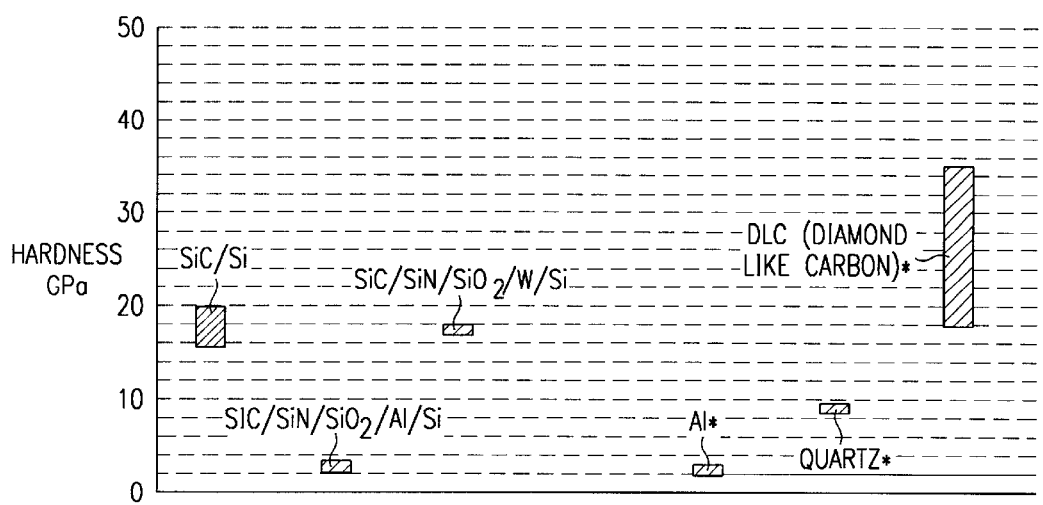
FIG. 2 is a graph showing the hardness of various materials and material combinations employed within a sensor circuit.

In the present invention, none of the metallization levels—contacts 128, metal regions 130, vias 134, capacitive electrodes 136, or ESD protection patterns 140—are formed of aluminum. A cause of "scratch" damage in capacitive sensor circuits of the type described above has been determined to be aluminum: the layer is too weak, and may delaminate, causing circuit failure, even if the passivation integrity is not violated. The hardness of various materials and material combinations is shown in the graph of FIG. 2. The hardness of materials for which the graph label includes an asterik ("*") were taken from literature references, while the other hardness values were determined experimentally.

As shown in FIG. 2, silicon dioxide ("quartz," or simply "oxide"), which is commonly employed as an interlevel dielectric, has a hardness of slightly less than 10 gigapascals (GPa). Silicon carbide (SiC), which is a suitable passivation material, and silicon together have an even greater hardness, comparable to that of diamond-like carbon (DLC). However aluminum, the most common metallization material, has a hardness much lower than quartz. The hardness of silicon carbide, a passivation material, and silicon, from which most substrates are formed, are much greater than that of aluminum. Since aluminum electrodes are typically between two such very hard layers, the tendency of aluminum to collapse and/or delaminate under sufficient pressure is not surprising.

A capacitive sensor circuit of the type described above typically includes a plurality of layer, including: silicon carbide and silicon nitride, which form a suitable passivation layer; silicon dioxide, a suitable interlevel dielectric; aluminum, the most commonly-employed metal for metallization levels; and silicon, the conventional material for an integrated circuit substrate. However, a sequence of layers of different materials is unlikely to have a total hardness significantly greater than that of the constituent material having the lowest hardness. Thus, micro scratch results within FIG. 2 for the sequence of layers described above (SiC/SiN/SiO$_2$/Al/Si) demonstrate that the combined hardness is, as expected, not significantly greater than that of aluminum alone.

In the present invention, this problem is solved by employing a hard conductive material in place of aluminum for all metallization levels. Tungsten (W) has a suitable hardness, as illustrated in FIG. 2 by micro scratch results for the sequence of layers described above with tungsten substituted for aluminum (i.e., SiC/SiN/SiO$_2$/W/Si). Other suitably hard conductive materials include copper (Cu) and titanium nitride (TiN), and perhaps conductive polysilicon. The hardness of the conductive material selected for the metallization levels should preferably exceeds the lowest hardness of any other material employed. In most structures, the material (other than aluminum) having the lowest hardness will commonly be the interlevel dielectric oxide. Any material having a hardness greater than that of aluminum, however, will provide better scratch resistance protection.

Figure 3:
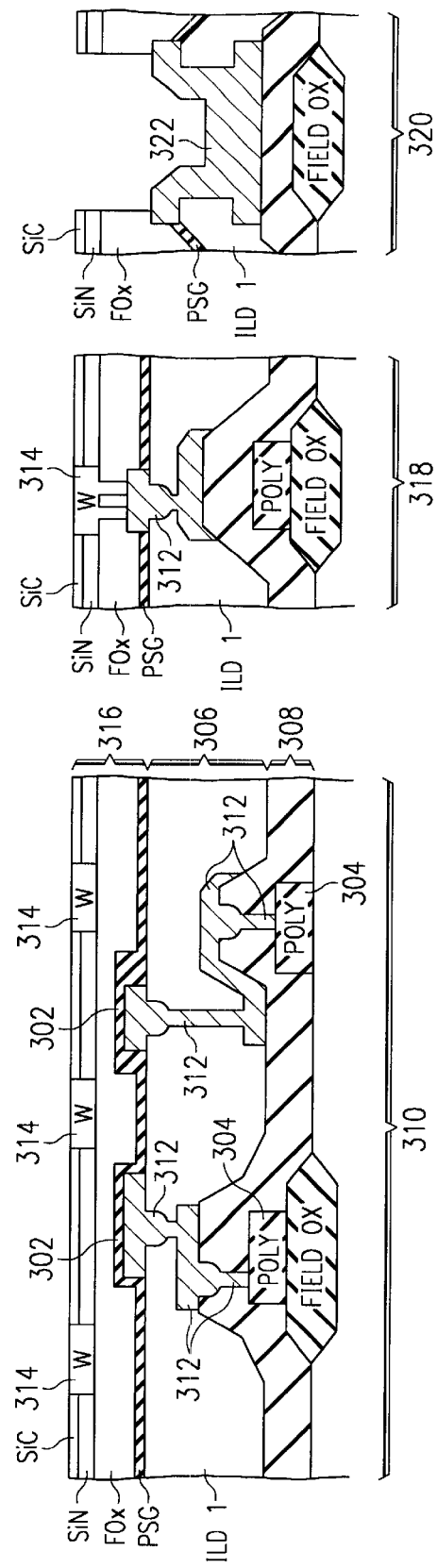
FIG. 3 depicts utilization of a hard conductive material within a sensor circuit for improved scratch resistance in accordance with a preferred embodiment of the present invention.

With reference now to FIG. 3, utilization of a hard conductive material within a sensor circuit for improved scratch resistance in accordance with a preferred embodiment of the present invention is depicted. Capacitive electrodes 302 are connected to underlying conductive polysilicon structures 304, which may be gate electrodes, source/drain contacts, or interconnects, through an interlevel dielectric 306 and a lower dielectric layer 308. Within a sensor area 310 of the integrated circuit, to which physical contact with the sensor circuit is expected, the conductive regions 312 connecting capacitive electrodes 302 to polysilicon conductors 304, together with the capacitive electrodes 302 themselves and ESD protection lines 314 within passivation 316, are all formed of a conductive material having a hardness greater than that of aluminum. Tungsten is preferable since the hardness of tungsten provides suitable scratch resistance and known processes for forming tungsten contacts, vias, and interconnects may be readily substituted for aluminum metallization processes. Other metals for which processing techniques are now known or may be developed, such as copper, may also be employed if sufficiently hard.

Within the periphery and pad areas 318 and 320 of the capacitive circuit, which physical contact is neither expected nor necessary and where mechanical scratch protection may be built into the sensor circuit packaging, aluminum conductive regions may be employed to connect ESD protection lines 314 to underlying circuitry and for pads 322. However, for simplicity in processing, tungsten may alternatively be employed for all metallization levels in all areas of the sensor circuit.

In the present invention, aluminum metallization within an integrated circuit is replaced by a conductive material having a greater hardness, resulting in improved "scratch" resistance for integrated circuit. This may be employed in any integrated circuit, but is especially useful in sensor array circuits employed for fingerprint or signature acquisition. Combined with hard passivation, the present invention improves the performance and lifetime of sensor circuits for which direct physical contact with a finger, stylus, or other object is required.

While the invention has been particularly shown and described with reference to a preferred embodiment, it will be understood by those skilled in the art that various changes in form and detail may be made therein without departing from the spirit and scope of the invention.

What is claimed is:

1. An integrated circuit structure, comprising:
   an active region;
   a dielectric overlying the active region and having a contact opening therethrough;
   a tungsten contact within the contact opening;
   a tungsten metal region overlying the contact and a portion of the dielectric;
   an interlevel dielectric overlying the tungsten metal region and the dielectric and having an opening therethrough;
   a tungsten via within the opening through the interlevel dielectric;
   a tungsten capacitive electrode overlying the tungsten via and a portion of the interlevel dielectric, wherein the capacitive electrode is electrically connected to the active region by the contact, the metal region, and the via;
   an oxide over the capacitive electrode and the interlevel dielectric over the capacitive electrode;
   a passivation layer including a silicon nitride layer and a silicon carbide layer over the oxide; and
   tungsten ESD protection within the passivation layer.

2. An integrated circuit, comprising:
   an array of capacitive electrodes in a central portion of the integrated circuit; and
   ESD protection devices and contact pads around a periphery of the integrated circuit,
   wherein the capacitive electrodes and every metallization region beneath the array of capacitive electrodes within the central portion of the integrated circuit is formed of a material having a hardness greater than aluminum while at least one metallization region beneath an ESD protection device or contact pad is formed of aluminum.

3. The integrated circuit of claim 2, wherein every metallization region within the central portion of the integrated circuit is formed of tungsten.

4. The integrated circuit of claim 3, further comprising:
   tungsten ESD protection above and between capacitive electrodes within the array of capacitive electrodes and within the central portion of the integrated circuit, wherein each capacitive electrode within the array is formed of tungsten;
   tungsten vias beneath each capacitive electrode;
   tungsten interconnects beneath each tungsten via;
   tungsten contacts beneath each tungsten interconnect; and
   active regions beneath each tungsten contact.

5. The integrated circuit structure of claim 1, wherein the active region is a gate electrode.

6. The integrated circuit structure of claim 1, further comprising:
   an array of tungsten capacitive electrodes including the capacitive electrode.

7. The integrated circuit structure of claim 6, wherein the array of tungsten capacitive electrodes is located in a central portion of an integrated circuit.

8. The integrated circuit structure of claim 7, further comprising:
   ESD protection devices and contact pads around a periphery of the integrated circuit,
   wherein every metallization region beneath the array of capacitive electrodes within the central portion of the integrated circuit is formed of a material having a hardness greater than aluminum while at least one metallization region beneath an ESD protection device or contact pad is formed of aluminum.

9. The integrated circuit structure of claim 8, wherein every metallization region beneath the array of capacitive electrodes within the central portion of the integrated circuit is formed of tungsten.

10. The integrated circuit structure of claim 7, wherein every metallization region within the central portion of the integrated circuit is formed of tungsten.

11. The integrated circuit of claim 10, further comprising:
    tungsten ESD protection above and between capacitive electrodes within the array of tungsten capacitive electrodes and within the central portion of the integrated circuit;
    tungsten vias beneath each capacitive electrode;
    tungsten interconnects beneath each tungsten via;
    tungsten contacts beneath each tungsten interconnect; and
    active regions beneath each tungsten contact.

* * * * *